US009570309B2

(12) United States Patent
Webb et al.

(10) Patent No.: US 9,570,309 B2
(45) Date of Patent: Feb. 14, 2017

(54) MASK ALIGNMENT SYSTEM FOR SEMICONDUCTOR PROCESSING

(71) Applicant: Varian Semiconductor Equipment Associates, Inc., Gloucester, MA (US)

(72) Inventors: Aaron P. Webb, Austin, TX (US); Charles T. Carlson, Cedar Park, TX (US); William T. Weaver, Austin, TX (US); Christopher N. Grant, Dripping Springs, TX (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 572 days.

(21) Appl. No.: 14/101,974

(22) Filed: Dec. 10, 2013

(65) Prior Publication Data

US 2014/0170783 A1 Jun. 19, 2014

Related U.S. Application Data

(60) Provisional application No. 61/736,615, filed on Dec. 13, 2012.

(51) Int. Cl.
*H01L 21/266* (2006.01)
*H01L 21/68* (2006.01)

(52) U.S. Cl.
CPC .......... *H01L 21/266* (2013.01); *H01L 21/682* (2013.01)

(58) Field of Classification Search
CPC .............................. H01L 21/226; H01L 21/682
USPC .............................. 250/491; 438/14; 425/150
See application file for complete search history.

(56) References Cited

U.S. PATENT DOCUMENTS

| 3,996,835 | A | * | 12/1976 | Chromy | F16B 13/126 411/80.6 |
| 6,003,828 | A | * | 12/1999 | Kawahashi | G03F 1/14 248/576 |
| 7,396,558 | B2 | * | 7/2008 | Fujimori | C23C 14/042 118/721 |

(Continued)

FOREIGN PATENT DOCUMENTS

EP 1318541 A2 11/2003

OTHER PUBLICATIONS

International Search Report and Written Opinion mailed Mar. 12, 2014 for PCT/US2013/074423 filed Dec. 11, 2013.

*Primary Examiner* — Wyatt Stoffa

(57) ABSTRACT

A mask alignment system for providing precise and repeatable alignment between ion implantation masks and workpieces. The system includes a mask frame having a plurality of ion implantation masks loosely connected thereto. The mask frame is provided with a plurality of frame alignment cavities, and each mask is provided with a plurality of mask alignment cavities. The system further includes a platen for holding workpieces. The platen may be provided with a plurality of mask alignment pins and frame alignment pins configured to engage the mask alignment cavities and frame alignment cavities, respectively. The mask frame can be lowered onto the platen, with the frame alignment cavities moving into registration with the frame alignment pins to provide rough alignment between the masks and workpieces. The mask alignment cavities are then moved into registration with the mask alignment pins, thereby shifting each individual mask into precise alignment with a respective workpiece.

14 Claims, 8 Drawing Sheets

(56) References Cited

U.S. PATENT DOCUMENTS

| | | | | |
|---|---|---|---|---|
| 2002/0102754 A1* | 8/2002 | Fujimori | C23C 14/042 | 438/22 |
| 2003/0108805 A1* | 6/2003 | Clark | C23C 14/042 | 430/22 |
| 2003/0234919 A1* | 12/2003 | Tajima | G03F 7/2014 | 355/78 |
| 2008/0073569 A1* | 3/2008 | Teodorczyk | C23C 14/042 | 250/491.1 |
| 2008/0202421 A1* | 8/2008 | Allen | H01L 21/682 | 118/720 |
| 2010/0322754 A1* | 12/2010 | Lee | C23C 16/042 | 414/749.6 |
| 2011/0051115 A1* | 3/2011 | Shimane | C23C 14/042 | 355/73 |
| 2012/0070999 A1* | 3/2012 | Lindenberg | C23C 14/042 | 438/758 |

* cited by examiner

US 9,570,309 B2

MASK ALIGNMENT SYSTEM FOR SEMICONDUCTOR PROCESSING

STATEMENT REGARDING FEDERALLY SPONSORED RESEARCH OR DEVELOPMENT

This Invention was made with U.S. Government support under Contract No. DE-EE0004737 awarded by the Department of Energy. The Government has certain rights in this invention.

FIELD OF THE DISCLOSURE

The disclosure relates generally to the field of semiconductor processing systems, and more particularly to a mask alignment system for an ion implanter.

BACKGROUND OF THE DISCLOSURE

Ion implantation is a technique for introducing conductivity-altering impurities into semiconductor workpieces. During ion implantation, a desired impurity material is ionized in an ion source chamber, the ions are accelerated to form an ion beam of prescribed energy, and the ion beam is focused and directed toward the surface of a workpiece positioned in a process chamber. The energetic ions in the ion beam penetrate into the bulk of the workpiece material and are embedded into the crystalline lattice of the material to form a region of desired conductivity.

Two concerns of the solar cell manufacturing industry are manufacturing throughput and solar cell efficiency. Solar cell efficiency is a measure of the amount of solar energy that a solar cell is able to convert into electricity, and is closely tied to the precision with which a solar cell is manufactured. As technologies advance, higher solar cell efficiencies may be needed to stay competitive in the solar cell manufacturing industry. Improving precision while maintaining or improving manufacturing throughput is therefore highly desirable.

Ion implantation has been demonstrated as a viable method to dope solar cells in a precise manner. Use of ion implantation removes process steps needed for existing technology, such as diffusion furnaces. For example, a laser edge isolation step may be removed if ion implantation is used instead of furnace diffusion because ion implantation will only dope the desired surface. Besides removal of process steps, higher cell efficiencies have been demonstrated using ion implantation. Ion implantation also offers the ability to perform a blanket implant of an entire surface of a solar cell or a selective (or patterned) implant of only part of the solar cell. Selective implantation at high throughputs using ion implantation avoids the costly and time-consuming lithography or patterning steps used for furnace diffusion. Selective implantation also enables new solar cell designs.

In some cases, micron-level precision may be required for the implantation of certain types of solar cells to achieve necessary geometries and tolerances. For example, selective emitter (SE) and interdigitated backside contact (IBC) solar cells have doped regions that are only a few $\mu m$ apart. If a mask is used create such doped regions in a workpiece during ion implantation, the locations of the regions are dictated by the placement of the mask and the dimensions and/or geometry of the mask. The mask may therefore need to be repeatedly placed within approximately 20-40 $\mu m$ of a desired location to reliably meet manufacturing specifications. Otherwise, workpieces may not function as desired or subsequent processes employed in the manufacture of workpieces may not be properly aligned.

Any improvements to the precision, reliability, and speed with which solar cells are manufactured would be beneficial to solar cell manufacturers worldwide and may accelerate the adoption of solar cells as an alternative energy source.

SUMMARY

In accordance with the present disclosure, there is provided a mask alignment system for facilitating precise and repeatable alignment of ion implantation masks with workpieces that are to be implanted.

An exemplary embodiment of a mask alignment system in accordance with the present disclosure may include a mask frame having a plurality of ion implantation masks loosely connected thereto. The mask frame may be provided with a plurality of frame alignment cavities formed therein, and each mask may be provided with a plurality of mask alignment cavities formed therein. The system further includes a platen for holding a plurality of workpieces that are to be implanted. The platen may be provided with a plurality of mask alignment pins and a plurality of frame alignment pins that are configured to engage the mask alignment cavities and the frame alignment cavities, respectively. The mask frame may be lowered onto the platen, with the frame alignment cavities moving into registration with the frame alignment pins to provide rough alignment between the masks and workpieces. The mask alignment cavities may then be moved into registration with the mask alignment pins, thereby shifting each individual mask into precise alignment with a respective workpiece.

An exemplary method for aligning ion implantation masks with workpieces in accordance with the present disclosure may include the steps of lowering a mask frame having a plurality of masks onto a platen holding a plurality of workpieces, wherein the masks are movably connected to the mask frame, moving frame alignment cavities of the mask frame into registration with corresponding frame alignment pins on the platen, thereby roughly aligning the masks with the workpieces, and moving mask alignment cavities of the masks into registration with corresponding mask alignment pins on the platen, thereby shifting each mask into precise alignment with a respective workpiece.

DETAILED DESCRIPTION

Figure 1:
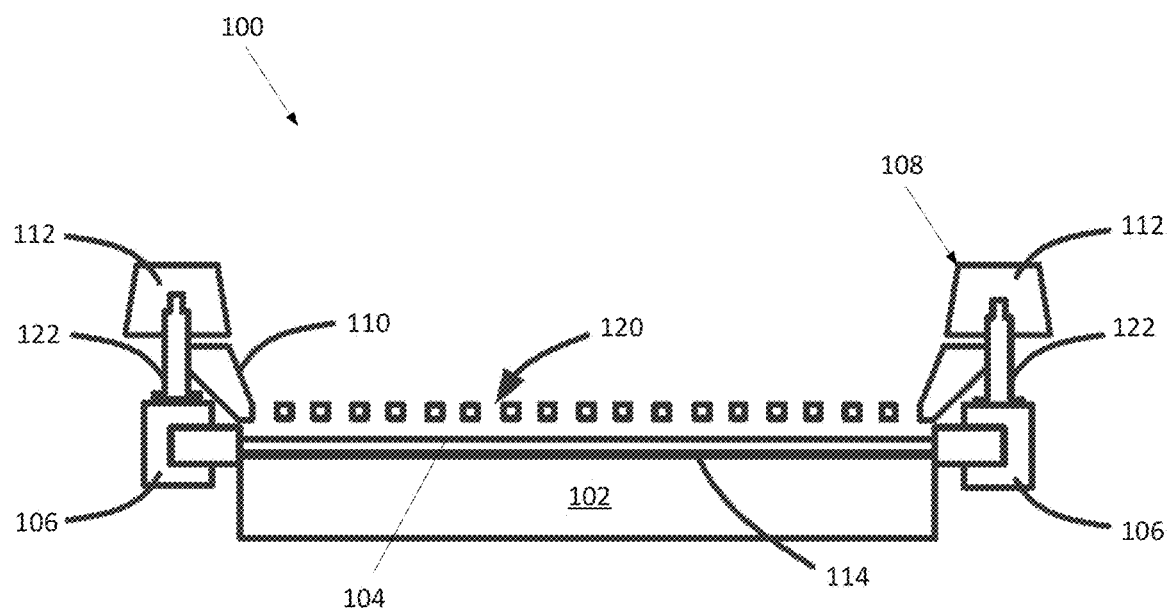
FIG. 1 is a side view in section illustrating an exemplary mask alignment system in accordance with the present disclosure.

A mask alignment system and method in accordance with the present disclosure will now be described more fully hereinafter with reference to the accompanying drawings, in which preferred embodiments of the system and method are shown. The system and method, however, may be embodied in many different forms and should not be construed as being limited to the embodiments set forth herein. Rather, these embodiments are provided so that this disclosure will be thorough and complete, and will fully convey the scope of the system and method to those skilled in the art. In the drawings, like numbers refer to like elements throughout.

Although the mask alignment system of the present disclosure is described herein in connection with an ion implanter and an associated ion implantation process, it is contemplated that the mask alignment system can be similarly implemented in a variety of other systems and processes, such as may be involved in the manufacture of solar cells or semiconductors, for example. Additionally, while the exemplary ion implanter disclosed herein is described in connection with the implantation of solar cells, it will be understood that such disclosure is provided for illustrative purposes only, and that the ion implanter can be similarly implemented for the implantation of other types of workpieces, including, but not limited to, semiconductor wafers, light emitting diodes (LEDs), silicon-on-insulator (SOI) wafers, and other such components.

FIG. 1 illustrates a partial side view in section of an exemplary embodiment of a mask alignment system 100 (hereinafter "the system 100") in accordance with the present disclosure. The system 100 may include a platen 102 for supporting one or more workpieces 104 (e.g. solar cells, wafers or the like), a carrier 106 that may at least partially secure and/or align the workpieces 104 on the platen 102, and a mask assembly 108 for facilitating selective ion implantation of the workpieces 104. The mask assembly 108 may include one or more masks 110 suspended from a mask frame 112 as further described below.

Figure 2:
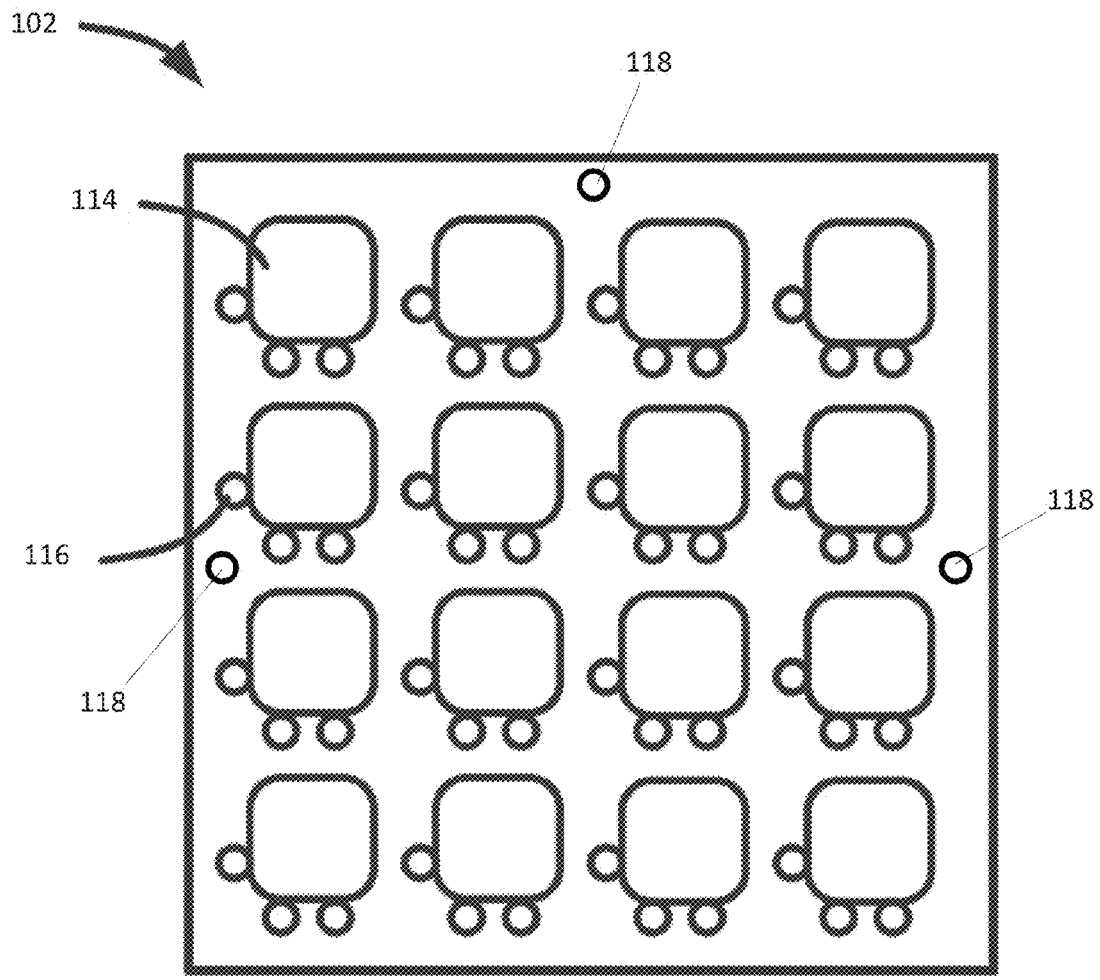
FIG. 2 is a top view illustrating an exemplary platen of the mask alignment system of the present disclosure.

FIG. 2 illustrates a top view of the platen 102 of the system 100. The platen 102 may include a plurality of chucks 114, each of which may be configured to securely clamp or hold an individual workpiece 104 during ion implantation thereof. In one non-limiting exemplary embodiment the chucks 114 may be electrostatic chucks. The platen 102 may include a square, 4×4 matrix of 16 chucks 114 as shown in FIG. 2. However, it is contemplated that the number and configuration of the chucks 114 may be varied without departing from the present disclosure.

The platen 102 may further include a plurality of mask alignment pins 116 positioned about the chucks 114. The mask alignment pins 116 may be provided for facilitating precise alignment of each mask 110 of the mask assembly 108 to a respective chuck 114 and workpieces 104 on the platen 102 as will be further described below. In the illustrated embodiment, each chuck 114 is surrounded by three mask alignment pins 116, with two mask alignment pins 116 disposed adjacent to a first side of each chuck 114 and one mask alignment pin 116 disposed adjacent to a second side of each chuck 114. It will be appreciated that the number and positions of the mask alignment pins 116 may be varied from that shown in the illustrated embodiment without departing from the present disclosure. The mask alignment pins 116 may be formed of silicon carbide or any other sufficiently durable and thermally resistant material, for example.

The platen 102 may further include several frame alignment pins 118 disposed adjacent to the periphery of the platen 102. The frame alignment pins 118 may facilitate initial alignment of the mask frame 112 with the platen 102 as will be further described below. In the illustrated embodiment the platen 102 includes three frame alignment pins 118, with one frame alignment pin 118 disposed adjacent to one of three sides of the platen 102. It will be appreciated, however, that the number and positions of the frame alignment pins 118 on the platen 102 may be varied without departing from the present disclosure.

Figure 3:
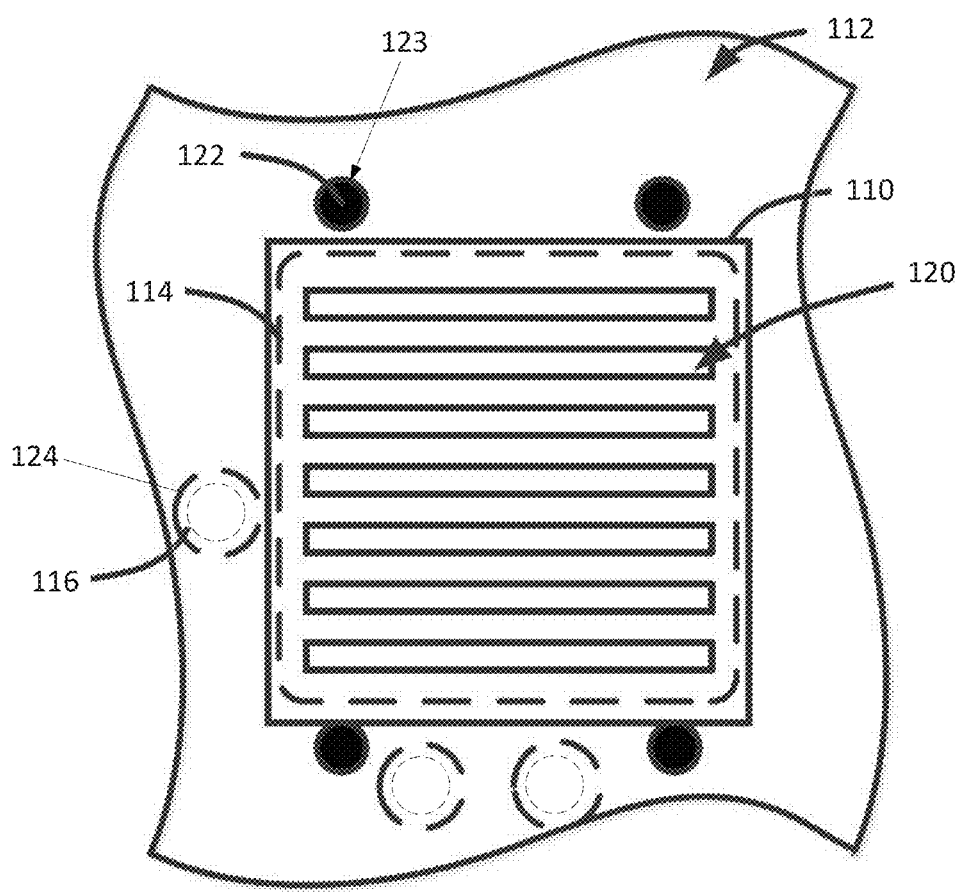
FIG. 3 is a partial top view illustrating an exemplary mask of the mask alignment system of the present disclosure.
Figure 4:
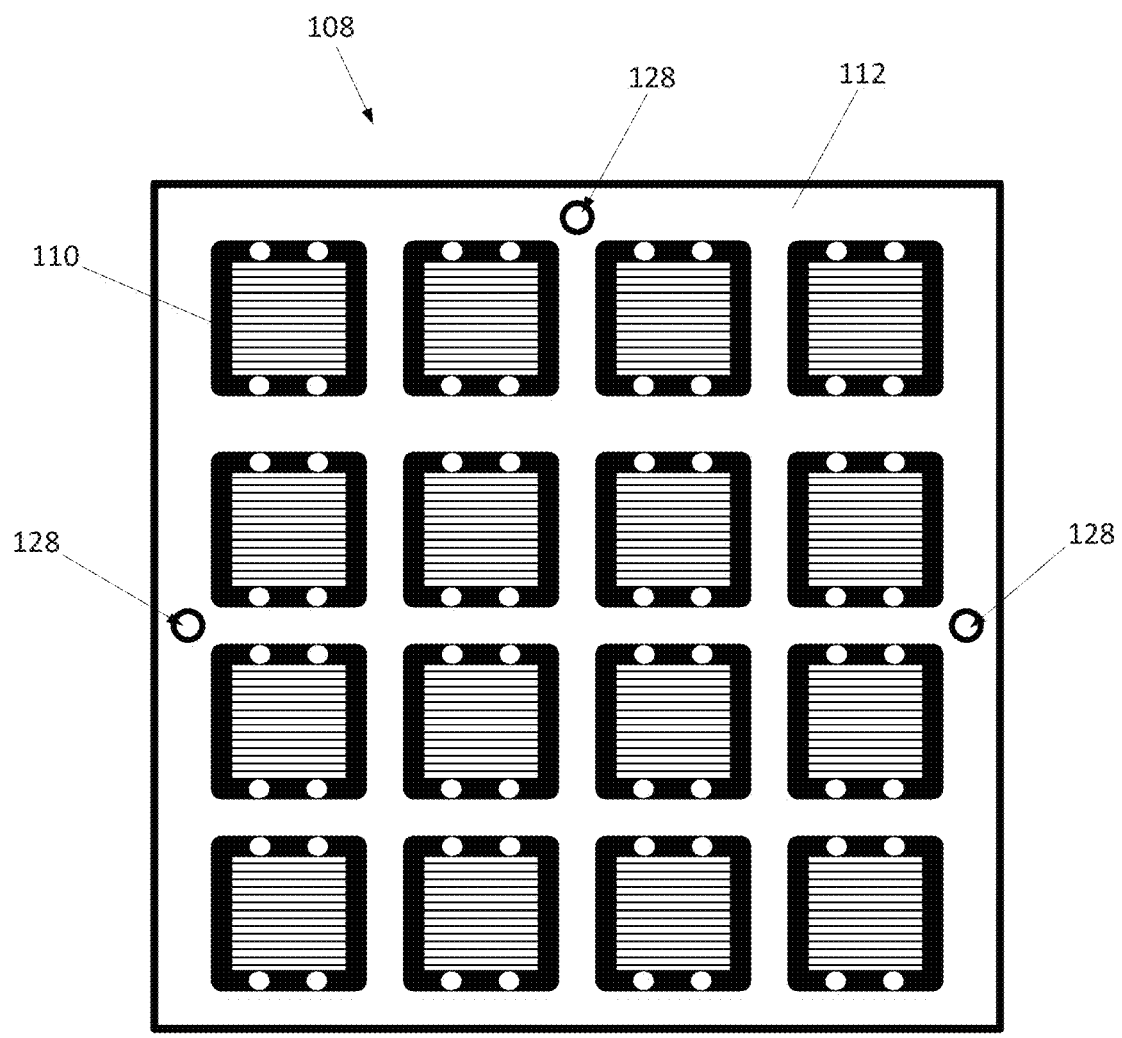
FIG. 4 is a bottom view illustrating an exemplary mask assembly of the mask alignment system of the present disclosure.

FIG. 3 is a partial top view illustrating a portion of the mask frame 112 and one of the masks 110 of the mask assembly 108. It will be understood that the mask 110 shown in FIG. 3 is representative of, and is substantially identical to, all of the other masks 110 of the mask assembly 108 (all of the masks 110 are shown in FIG. 4). The mask frame 112 and the mask 110 are shown covering one of the chucks 114 and its corresponding mask alignment pins 116, which are drawn with dashed lines since they are obscured. The mask 110 may be provided with one or more apertures 120 which permit an ion beam to pass therethrough for selective, patterned implantation of a workpiece 104 on the chuck 110 below. In the illustrated embodiment the apertures 120 are shown as a series of parallel slots in the mask 110, but it will be appreciated by those of ordinary skill in the art that the size and shape of the apertures 120 may be varied to achieve substantially any desired pattern for selective ion implantation of a workpiece 104.

The mask 110 may be coupled to the mask frame 112 by a plurality of bolts 122. In one non-limiting exemplary embodiment the bolts 122 may be spring-loaded shoulder bolts that act to bias the mask 110 away from the mask frame 112 while still allowing the mask 110 to be moved toward the mask frame 112 upon the application of force sufficient to overcome the bias. The bolts 122 may pass through apertures 123 in the mask 110. The apertures 123 may have diameters that are slightly larger than the diameters of the respective bolts 122 received therein. In this way the mask 110 may therefore be loosely held to the mask frame 112, and may thus be provided with a degree of horizontal movement or "play" relative to the mask frame 112. For example, in one non-limiting exemplary embodiment the mask 110 may be able to move about 0.25 inches horizontally (i.e. up, down, left, or right in the top view of FIG. 3) relative to the mask frame 112 while still being retained to the mask frame by the bolts 122. This "play" may facilitate precise alignment of each mask 110 of the mask assembly 108 to a respective chuck 110 and workpiece 104, as will be further described below.

Still referring to FIG. 3, the mask 110 may include a plurality of mask alignment cavities 124 (shown in dashed lines) formed in the underside of the mask. These mask alignment cavities 124 may be sized and configured to receive the mask alignment pins 116 of the platen 102 (described above) when the mask frame 112 is positioned on the platen 102, such as during a semiconductor processing operation such as ion implantation. The number, locations, and configuration of the mask alignment cavities 124 may be the same as the number, locations, and configuration of the mask alignment pins 116 that surround the chuck 114. Moreover, each mask alignment cavity 124 may have one or more contoured interior surfaces 126 (see FIG. 5) configured so that an alignment pin 116 can initially enter a mask alignment cavity 124 out of alignment therewith, and will then engage the contoured surface 126 and will be guided into alignment with the mask alignment cavity 124 as the mask alignment pin 116 is inserted further therein. In one exemplary non-limiting embodiment, the mask alignment pin 116 may be a cylindrical pin, and the mask alignment cavity 124 may have a conical shape or an inverted V-shape such that the tip of the mask alignment pin 116 will, during insertion into the mask alignment cavity 124, be guided into a narrowest portion 125 of the mask alignment cavity 124 to establish a desired alignment therebetween.

In some embodiments the mask alignment cavities 124 may extend only partially through the mask 110 so that the mask alignment pins 116 are not exposed to ions that strike the top of the mask 110. Alternatively, it is contemplated that the mask alignment cavities 124 may extend completely through the mask 110. The surfaces of the mask 110 that define the mask alignment cavities 124 may be coated with silicon carbide to increase durability and resistance to wear that might otherwise result from repeated engagement with the mask alignment pins 116.

FIG. 4 illustrates a bottom view of the mask assembly 108, including the masks 110 and the mask frame 112. The mask assembly 108 may include a 4×4 matrix of 16 masks 110 that is substantially similar to the 4×4 matrix configuration of the chucks 114 on the platen 102 (described above). The masks 110 may be fabricated of graphite in one instance, though other appropriate materials, such as silicon carbide, may alternatively be used. The mask frame 112 may be fabricated of graphite or carbon-carbon, though other appropriate materials may be used. As shown, the mask frame 112 may include a plurality of frame alignment cavities 128 formed in the underside thereof. The frame alignment cavities 128 may be sized and configured to matingly receive the frame alignment pins 118 of the platen 102 (described above) when the mask frame 112 is positioned on the platen 102, such as during semiconductor processing applications, such as ion implantation operations. In one non-limiting exemplary embodiment, the number, locations, and configuration of the frame alignment cavities 128 in the mask frame 112 may be the same as the number, locations, and configuration of the frame alignment pins 118 on the platen 102. Moreover, each frame alignment cavity 128 may have a size and shape that are suitable for receiving a respective frame alignment pin 118 therein.

Figure 5:
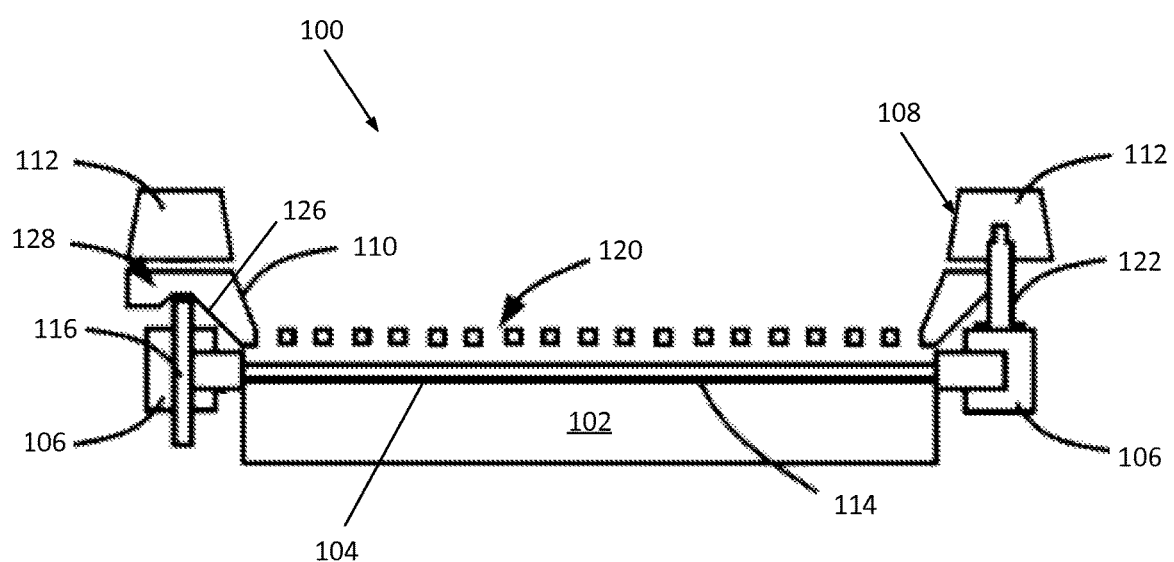
FIG. 5 is another side view in section illustrating the exemplary mask alignment system in accordance with the present disclosure

The loose connections between the masks 110 and the mask frame 112 provide the masks 110 with a movement tolerance that substantially matches the kinematic capture range of the frame alignment cavities 128 relative to the frame alignment pins 118. Thus, when the mask frame 112 is mounted on the platen 102 as shown in FIG. 5, the above-described registration between the frame alignment cavities 128 and the frame alignment pins 118 may establish an initial, rough alignment (e.g., within 0.25 inches) between each mask 110 and its respective chuck 114 and workpiece 104 on the platen 102. Such rough alignment may be sufficient to allow the mask alignment cavities 124 of each mask 110 to capture their respective mask alignment pins 116 on the platen 102, even if each mask 110 is not precisely aligned with its respective chuck 114 and workpiece 104 as may be desired for precise processing operations. However, as the mask assembly 108 is lowered further onto the platen 102, the mask alignment pins 116 may engage the contoured surfaces 126 of their respective mask alignment cavities 124 and through such engagement and continued relative movement the mask alignment pins 116 may be guided into precise registration with the mask alignment cavities 124 in the manner discussed above. Thus, each mask 110 within the mask frame 112 may automatically and individually move into precise alignment with its respective chuck 114 and workpiece 104, wherein the workpieces 104 may have been previously positioned, and at least partially retained and/or aligned by the engagement with respective mask alignment pins 116 on the platen 102. The mask alignment pins 116 may therefore serve to precisely locate the workpieces 104 on the chucks 114 as well as to precisely align the masks 110 to the workpieces 104. It should be appreciated that the view shown in FIG. 5 is representational, and thus in some embodiments the mask alignment pin 116 and the bolt 122 may not be located in the same cross-sectional plane.

The system 100 described herein thus enables gross kinematic alignment of the mask frame 112 and fine kinematic alignment of the individual masks 110. For example, overall alignment within approximately 20 μm of a desired location can be achieved with the disclosed arrangement. Since the masks 110 are aligned substantially independently of the mask frame 112, precise alignment of the masks 110 can be achieved in a highly repeatable and reliable manner despite variations in the geometry of the mask frame 112 that may result from wear, thermal expansion and contraction, and/or manufacturing defects, for example.

Figure 6:
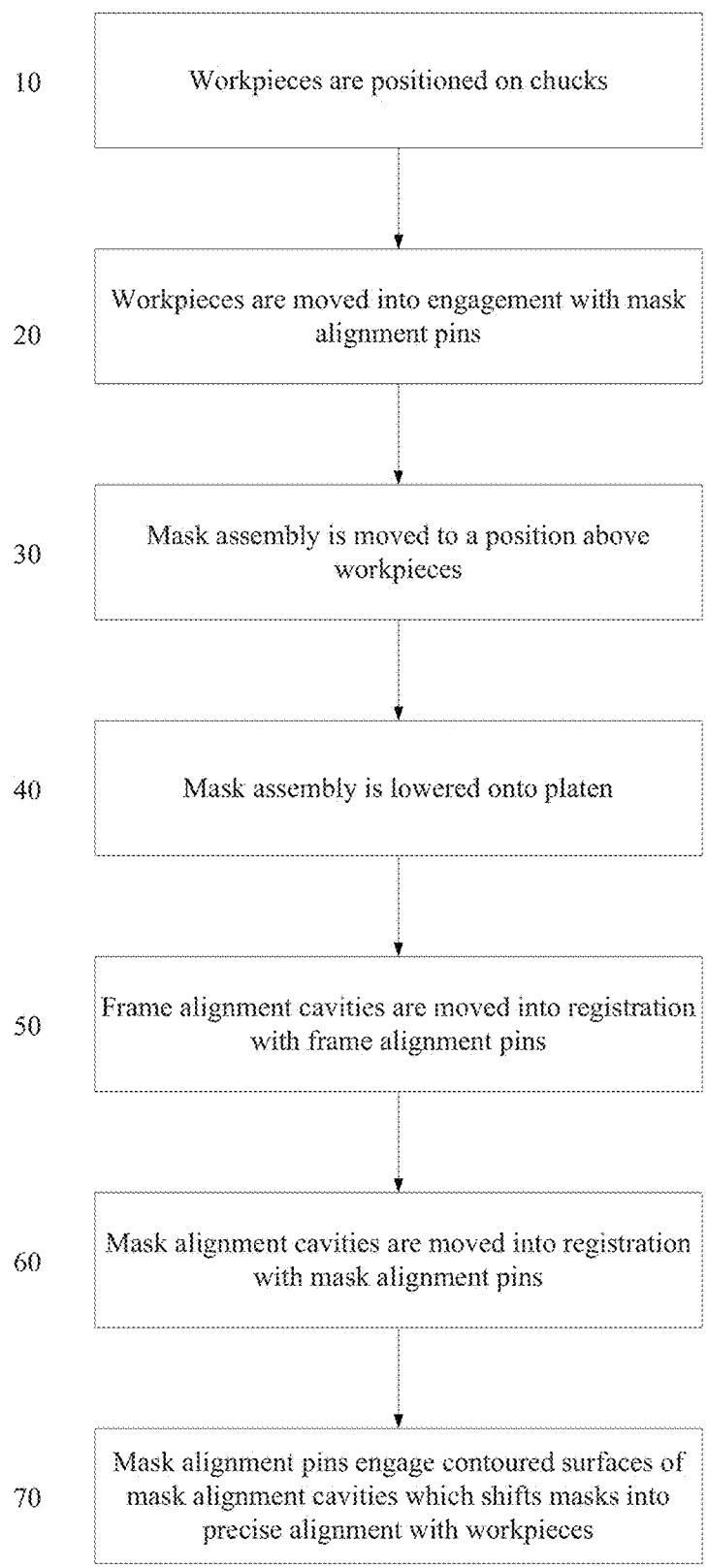
FIG. 6 is a flow diagram illustrating an exemplary method for aligning a mask in accordance with the present disclosure.

Referring now to FIG. 6, a flow diagram illustrating an exemplary method for operating the system 100 in accordance with the present disclosure is shown. The method will now be described in conjunction with the schematic representations of the system 100 shown in FIGS. 1-5.

At a first step 10 of the exemplary method, a plurality of workpieces 104 to be processed may be positioned on respective chucks 114 of the platen 102, which may include placing each workpiece 104 within a carrier 106. At step 20, each workpiece 104 may be moved into engagement with a plurality of respective mask alignment pins 116, thereby securing and/or aligning each workpiece 104 in a predetermined location and orientation.

At step 30, the mask assembly 108 may be moved to a position above the workpieces 104. At step 40, the mask assembly 108 may be lowered onto the platen 102. As the mask assembly 108 is lowered onto the platen 102, the frame alignment cavities 128 of the mask frame 112 may, at step 50, move into registration with the frame alignment pins 118 of the platen 102. Such registration may position the mask frame 112 relative to the platen 102 such that the masks 110 on the mask frame 112 are roughly aligned (e.g., within 0.25 inches) with their respective chucks 114 and workpieces 104 on the platen 102.

As the mask assembly 108 is lowered further onto the platen 102, the mask alignment cavities 124 of the mask frame 112 may, at step 60, may move into initial registration with the mask alignment pins 116 of the platen 102, wherein such initial registration is facilitated by the rough alignment produced by the registration of the frame alignment cavities 128 with the frame alignment pins 118 in step 50. As the mask assembly 108 is lowered still further onto the platen 102, the mask alignment pins 116 may, at step 70, engage the contoured surfaces 126 of the mask alignment cavities 124, which may guide the mask alignment pins 116 into precisely located final registration therewith. Each mask 110 may thereby be individually and precisely aligned with its respective chuck 114 and workpiece 104 irrespective of deformations or imperfections in the geometry of the mask frame 112. One or more semiconductor processing steps may then be performed, such as selective ion implantation of the workpieces 104.

In some embodiments the mask frame 112 of the present disclosure may include thermal expansion points at the intersections of linear alignment features. This may help minimize the effect of thermal expansion misalignment between the masks 110 and workpieces 104 that are to be selectively implanted. These thermal expansion points can be positioned in the mask frame 112. As the mask frame 112 heats up, bullnose pins, for example, may enable expansion so that the center of the mask frame 112 remains in the same location. Thus, any thermal expansion "grows" from the center of the mask frame 112 to minimize misalignment. Thus bullnose pins designs may have intersecting lines of motion at the center of the mask frame 112. The masks 110 may grow outward from any cavities or bolts holding the masks 110 in the mask frame 112. The masks 110 may grow at a similar rate as the mask frame 112. Due to the direction of growth of the masks 110 and mask frame 112, these components may remain in the same overall positions relative to each other during thermal expansion.

In other embodiments, the mask frame 112 and masks 110 may be machined smaller than desired. This may enable the mask frame 112 and mask 110 to expand to a desired size at the processing temperature, such as after being exposed to an ion beam.

Figure 7:
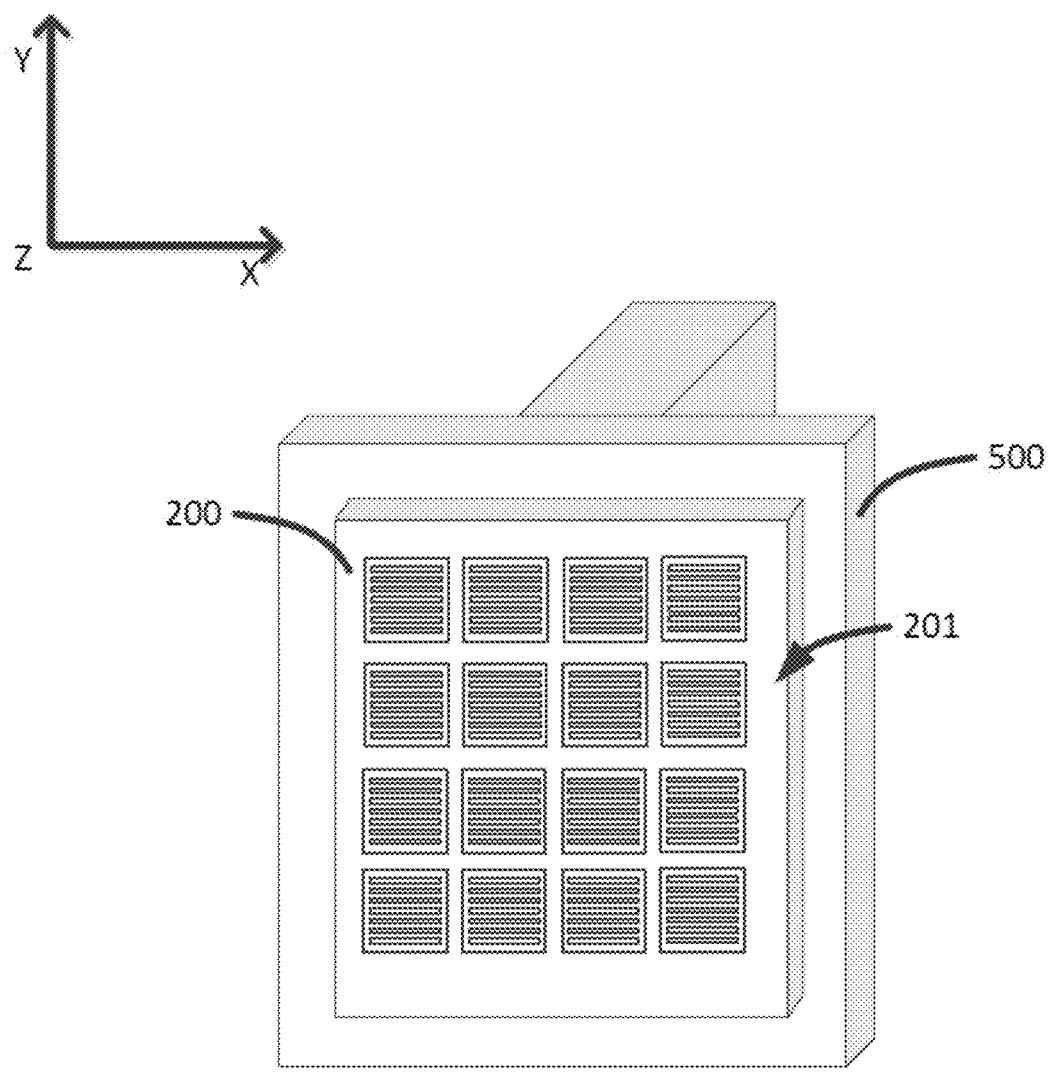
FIG. 7 is a perspective view illustrating an exemplary mask frame in a transfer device in accordance with the present disclosure.

FIG. 7 is a perspective view of an arrangement for moving an exemplary mask frame 200 into position using a transfer device 500. The mask frame 200 containing a plurality of individual masks 201 may be coupled to the transfer device 500. This transfer device 500 can move the mask frame 200 in three dimensions using an actuator. For example, the transfer device 500 may move the mask frame 200 in the Z-direction onto a platen (such as platen 101 in FIGS. 8A-8C) or in the X-direction to remove the mask frame 200 from the path of the ion beam. Magnetic clamping, mechanical clamping, or other systems may be used to support the mask frame 200 on the transfer device 500. It will be appreciated that although the transfer device 500 is illustrated as a block, it may be a frame or other shapes.

Figure 8A:
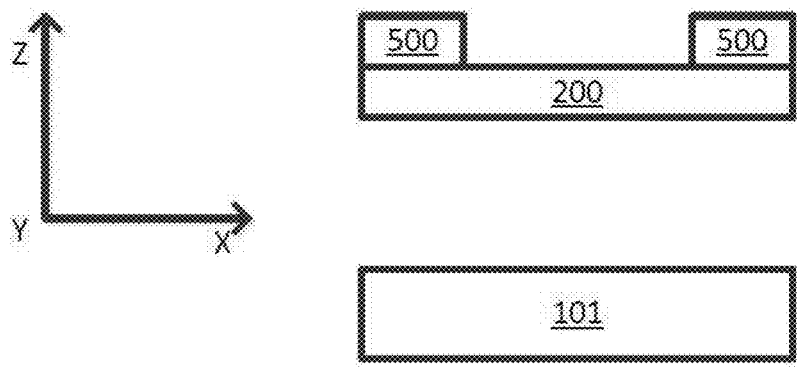
FIG. 8A-C are a series of schematic views illustrating the transfer of a mask frame onto a platen in accordance with the present disclosure.
Figure 8B:
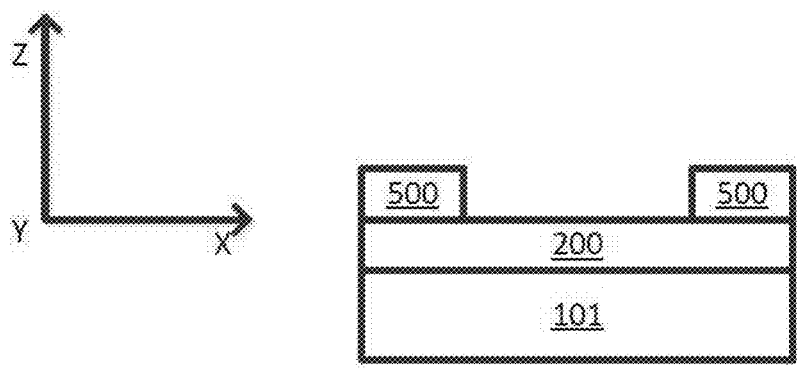
Figure 8C:
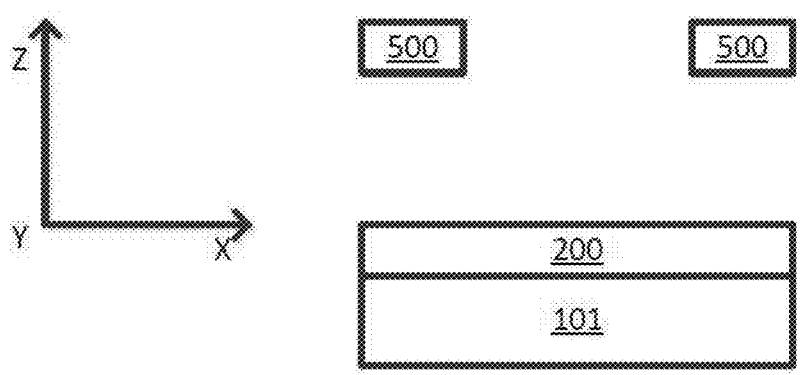

FIGS. 8A-C illustrate exemplary stages in the transfer of an exemplary mask frame 200 using the transfer device 500. For example, the mask frame 200 is transported to and from the platen 102 using the transfer device 500. In FIG. 8A, the transfer device 500 is shown engaged with the mask frame 200, to position the mask frame proximate the platen 102. This may include the use of an actuator (not shown) to transport or manipulate the position of the transfer device 500. In FIG. 8B, the mask frame 200 has been placed on the platen 101 after being moved in the Z-direction by the transfer device 500. In FIG. 8C, the mask frame 200 has been released from the transfer device 500 and is engaged with the platen 101. The mask frame 200 may be aligned to the platen 101 and the masks (e.g., masks 201 (FIG. 7)) in the mask frame 200 may be aligned to the workpieces (not illustrated) on the platen 101 as previously discussed.

When connecting, the mask frame 200 aligns to the platen 101 and the masks 201 are aligned to workpieces on the platen 102. This connection of mask frame 200 to the platen 101 may occur in a single phase or in two or more phases. In addition, the speed at which the mask frame 200 is moved into engagement with the platen 101 (i.e., movement in the Z-direction) may the constant, or it may vary over the course of a single continuous phase, or it may occur in two phases.

Removal of the mask frame 200 from the platen 101 can be performed by connecting the mask frame 200 to the transfer device 500 and moving the two in the Z-direction opposite the platen 101. When not in use, the mask frame 200 may be stored proximate a heater to avoid cyclic thermal expansion.

As used herein, an element or step recited in the singular and proceeded with the word "a" or "an" should be understood as not excluding plural elements or steps, unless such exclusion is explicitly recited. Furthermore, references to "one embodiment" of the present invention are not intended to be interpreted as excluding the existence of additional embodiments that also incorporate the recited features.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. These other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A mask alignment system comprising:
    a mask frame having a plurality of frame alignment cavities formed therein;
    an ion implantation mask movably connected to the mask frame, the mask having a plurality of mask alignment cavities formed therein; and
    a platen having a plurality of mask alignment pins extending therefrom, the plurality of mask alignment pins configured to engage the mask alignment cavities, the platen further having a plurality of frame alignment pins extending therefrom, the plurality of frame alignment pins configured to engage the frame alignment cavities;
    wherein the mask is disposed between the mask frame and the platen and is configured to engage the platen.

2. The mask alignment system of claim 1, further comprising a chuck disposed on the platen for holding a workpiece.

3. The mask alignment system of claim 2 further comprising a carrier disposed on the platen for positioning the workpiece on the chuck.

4. The mask alignment system of claim 1, wherein at least one of the mask alignment cavities has a contoured surface that is configured to guide a respective mask alignment pin into a desired position with respect to the mask alignment cavity.

5. The mask alignment system of claim 4, wherein at least one mask alignment cavity is conical.

6. The mask alignment system of claim 4, wherein at least one mask alignment cavity is V-shaped.

7. The mask alignment system of claim 1, wherein the mask is connected to the mask frame by a plurality of bolts that loosely engage the mask.

8. The mask alignment system of claim 1, wherein the mask is biased away from the mask frame by at least one spring.

9. The mask alignment system of claim 1, wherein the mask alignment pins are configured to facilitate positioning of a workpiece on the platen.

10. A mask alignment method comprising:
lowering a mask frame having a plurality of ion implantation masks onto a platen holding a plurality of workpieces, wherein the masks are disposed between the mask frame and the platen and are movably connected to the mask frame;
moving frame alignment cavities of the mask frame into registration with corresponding frame alignment pins on the platen, thereby roughly aligning the masks with the workpieces; and
moving mask alignment cavities of the masks into registration with corresponding mask alignment pins on the platen, thereby shifting each mask into precise alignment with a respective workpiece.

11. The method of claim 10, further comprising placing each workpiece on a respective chuck on the platen to secure the workpieces on the platen.

12. The method of claim 11, further comprising moving each workpiece into engagement with a plurality of the mask alignment pins to position and align the workpieces on the platen.

13. The method of claim 10, further comprising placing each workpiece on a respective carrier on the platen to position the workpieces.

14. The method of claim 10, wherein the mask alignment cavities are defined by contoured surfaces, and wherein the step of moving the mask alignment cavities of the masks into registration with corresponding mask alignment pins on the platen comprises bringing the mask alignment pins into engagement with the contoured surfaces of respective mask alignment cavities, whereby the mask alignment pins are guided into precisely-located registration with the respective mask alignment cavities.

* * * * *